(12) United States Patent
Kitaoka

(10) Patent No.: US 6,754,302 B2
(45) Date of Patent: Jun. 22, 2004

(54) X-RAY EXPOSURE APPARATUS

(75) Inventor: Atsushi Kitaoka, Chiba (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 10/108,413

(22) Filed: Mar. 29, 2002

(65) Prior Publication Data

US 2002/0141533 A1 Oct. 3, 2002

(30) Foreign Application Priority Data

Apr. 2, 2001 (JP) ......................................... 2001-103635

(51) Int. Cl.[7] ............................................... G21K 5/00
(52) U.S. Cl. ....................................................... 378/34
(58) Field of Search ............................................ 378/34

(56) References Cited

U.S. PATENT DOCUMENTS

| | | | |
|---|---|---|---|
| 4,653,903 A | 3/1987 | Torigoe et al. | 355/53 |
| 4,825,453 A * | 4/1989 | Kembo et al. | 378/34 |
| 5,485,498 A * | 1/1996 | Waldo et al. | 378/34 |
| 5,581,590 A * | 12/1996 | Mori | 378/34 |
| 6,453,001 B2 * | 9/2002 | Watanabe | 378/34 |

FOREIGN PATENT DOCUMENTS

| | | |
|---|---|---|
| JP | 60-154527 | 8/1985 |
| JP | 61-161718 | 7/1986 |
| JP | 2000-260684 | 9/2000 |

* cited by examiner

*Primary Examiner*—Craig E. Church
(74) *Attorney, Agent, or Firm*—Fitzpatrick, Cella, Harper & Scinto

(57) ABSTRACT

An X-ray exposure apparatus includes an X-ray source for generating pulsed X-rays, which are emitted radially, and first to nth exposure devices, disposed in a position facing the X-ray source and receiving the X-rays in an approximately perpendicular direction, and which use the received X-rays. The exposure devices project patterns of first to nth masks onto respective ones of first to nth substrates that are to be exposed.

17 Claims, 11 Drawing Sheets

FIG. 8

| URL | http://www.maintain.co.jp/db/input.html |

MALFUNCTION DATABASE INPUT SCREEN

DATE OF OCCURRENCE [2000/3/15]~804
MODEL [**********]~801
SUBJECT MATTER [OPERATING MALFUNCTION (ERROR AT BOOTING)]~803
EQUIPMENT SERIAL NO. [465NS4580001]~802
DEGREE OF URGENCY [D]~805
CONDITION [LED CONTINUES FLASHING AFTER POWER IS TURNED ON]~806
COUNTERMEASURE METHOD [POWER TURNED ON AGAIN (RED BUTTON PUSHED AT START UP)]~807
PROGRESS REPORT [TEMPORARY MEASURES COMPLETED]~808

[SEND] [RESET]   810                     811              812
         LINK TO DATABASE OF RESULTS   SOFTWARE LIBRARY   OPERATING GUIDE

FLOW OF SEMICONDUCTOR DEVICE MANUFACTURE

X-RAY EXPOSURE APPARATUS

FIELD OF THE INVENTION

This invention relates to an X-ray exposure apparatus for manufacturing devices such as microdevices by transferring a pattern from a reticle such as a mask to a substrate such as a wafer using X-rays as the exposure light.

BACKGROUND OF THE INVENTION

Semiconductor exposure apparatus of a variety of forms are in use in order to manufacture microdevices such as IC and LSI devices. Such a semiconductor exposure apparatus has an exposure light source specific to the apparatus and is so adapted that a circuit pattern written on a mask or reticle is burned into a wafer, which has been coated with a photoresist, by light emitted from the exposure light source.

It is required that the exposure light source have a short wavelength in order to raise the scale of integration of the microdevices. An X-ray light source has been proposed and developed as one candidate for a short-wavelength exposure light source.

X-ray light sources well known in the art include one using a synchrotron ring and one (referred to as a "point-source X-ray source" below) in which a target substance is irradiated with laser-light pulses to generate a plasma, and the plasma is used to produce X-rays.

The synchrotron ring is advantageous in that the X-rays generated exhibit a high intensity. A disadvantage of the synchrotron ring is its large size. This apparatus is inefficient in terms of cost and installation space unless the apparatus is provided with 10 to 20 ports per light source and an exposure apparatus is connected to each port. The point-source X-ray source, on the other hand, generates X-rays of comparatively low intensity, bit is small in size and generally is used by connecting one exposure apparatus per light source.

Various X-ray generating mechanisms have also been proposed for the point-source X-ray source. All of the point-source X-ray sources are such that radial X-rays having a certain solid angle are emitted from the X-ray source. In order for the point-source X-ray source to be used for the exposure of microdevices, it is desired that the X-rays that are projected upon the mask and wafer be parallel. To achieve this, an implementation has been considered in which the X-rays emitted from the point-source X-ray source are introduced to the exposure apparatus upon having their angle of divergence reduced using an X-ray optics element referred to as a collimator.

FIG. 11 is a schematic view illustrating an example of the structure of an X-ray exposure apparatus having a point-source X-ray source according to the prior art. In the X-ray exposure apparatus shown in FIG. 11, X-rays emitted from a point-source X-ray source 901 at a certain solid angle are introduced into a collimator 902. The latter is designed in conformity with the solid angle of the X-rays introduced. X-rays output from the collimator 902 are introduced into an exposure unit 903. The design is such that the angle of all X-rays output from the collimator 903 will be approximately perpendicular to the surface direction of a mask within the exposure unit 903. An example of the structure of the collimator 903 is one in which a number of capillary tubes are shaped in accordance with the angle of the X-rays on the input and output sides and are bundled together. The exit of the point-source X-ray source 901, the collimator 902 and an X-ray window 906 are constructed in the form of a chamber in which a gas can be sealed. In order to suppress attenuation of the X-rays, highly pure helium gas is sealed within the chamber as the atmosphere and the interior of the chamber is held at atmospheric pressure or lower. Though FIG. 11 is an example by which the point-source X-ray source 901 and the collimator 902 are configured in an X-ray introduction chamber 905, several other examples of implementation are available.

X-rays are introduced into the exposure unit 903 from the X-ray introduction chamber 905 through the X-ray window 906. The latter is used as an X-ray introducing portion that serves also as a pressure partition if the pressure on the side of the X-ray introduction chamber 905 differs from that within the exposure unit 903. An example of the X-ray window 906 known in the art is a thin film obtained by forming beryllium to a thickness of several microns to several tens of microns. The exposure unit 903 is constructed to suppress attenuation of the X-rays, highly pure helium gas is sealed within the chamber of the exposure unit 903 as the atmosphere and the interior of the chamber is held at atmospheric pressure or lower. If the gas purity and pressure in the X-ray introduction chamber 905 are the same as those in the chamber of the exposure unit 903, the X-ray window 906 can be eliminated.

With regard to the exposure unit 903, a mask 904 is carried in and out by a mask transport device, which is not shown. The mask 904 is held by a mask chuck (not shown) in order that exposure may be performed.

A wafer 903 is carried in and out by a wafer transport device, which is not shown. The wafer 907 is held by a wafer chuck 909 mounted on a wafer stage 908 in order that exposure may be performed. The wafer stage 908 has a precision positioning mechanism for positioning an exposure area on the wafer 907 with respect to the mask 904.

X-rays introduced into the exposure unit 903 have their intensity measured by an X-ray sensor 910 outside the exposure area. On the basis of the measured X-ray intensity, the exposure unit 903 controls the X-ray source device in such a manner that the optimum amount of exposure will be obtained. For example, in the case of an X-ray source device that generates X-rays in a pulsed form, the amount of exposure is controlled by commanding the number of pulses generated and the intensity of each pulse.

However, in a case wherein the point-source X-ray source according to the prior art is such that one collimator is combined with one point-source X-ray source, a problem which arises is that a large part of the energy radiated from the light source is not utilized.

In FIG. 11, only area B is utilized in exposure; other areas A and C represent dead space. In order to facilitate an understanding of the concept, FIG. 11 is drawn in such a manner that all X-rays emanate from the X-ray emission point of the point-source X-ray source. In actuality, however, emission of unnecessary X-rays is undesirable and, therefore, X-rays are shielded in the point-source X-ray source or exterior thereto. In either case, it can be construed that the efficiency with which all of the radiated energy of the light source is utilized is poor owing to the placement of various devices.

In order to solve the foregoing problem, the area of the collimator opening should be enlarged relative to the X-rays that emanate from the point-source X-ray source. However, if is it attempted to merely enlarge the single collimator, an angular disparity with respect to the emission angle of the collimator will grow larger as the periphery of the collimator is approached. This makes designing the apparatus extremely difficult.

SUMMARY OF THE INVENTION

Accordingly, the present invention has been proposed to solve the foregoing problems of the prior art, and has as its object to provide an X-ray exposure apparatus in which the efficiency of utilization of all the radiant energy possessed by X-rays is raised over that of the prior art. The present invention adopts a creative approach wherein use is made of a plurality of collimators of a number that lend itself to actual design and one exposure unit is connected to each collimator.

Specifically, according to the present invention, the foregoing object is attained by providing an X-ray exposure apparatus comprising: an X-ray source for generating pulsed X-rays; first to nth exposure means which use X-rays emitted from the X-ray source, wherein the exposure means project patterns of first to nth masks onto respective ones of first to nth substrates that are to be exposed.

Here, "n" represents an integer of 2 or greater, but the upper limit on n is the maximum number of collimators that can be designed in view of structural limitations.

In a preferred embodiment, the X-ray exposure apparatus further comprises first to nth (where n represents an integer of 2 or greater) collimators for varying at least one of angle and intensity of X-rays generated by the X-ray source.

Thus, it is possible to provide and X-ray exposure apparatus having a plurality (n) of exposure units for manufacturing microdevices and the like, wherein efficient utilization of all the radiant energy possessed by X-rays emitted from a single point-source X-ray source is raised over that of the prior art.

In a preferred embodiment, the X-ray exposure apparatus further comprises first to nth shutters situated between the X-ray source and respective ones of the masks and having one, two or more shielding members for shielding X-rays that irradiate the masks, first to nth shutter drive units for driving respective ones of the shutters, and a shutter controller for controlling each of the shutters.

In a preferred embodiment, the shutter drive unit controls the first to nth shutters depending upon the state of the X-ray source and at least one state among the states of the first to nth exposure means.

In a preferred embodiment, timing of X-ray emission from the X-ray source is controlled by an X-ray emission trigger signal, the apparatus further comprising an X-ray emission trigger generating unit for generating the X-ray emission trigger signal depending upon the state of the X-ray source and at least one state among the states of the first to nth exposure means.

In a preferred embodiment, the intensity of X-rays from the X-ray source is controlled by an X-ray intensity control signal, the apparatus further comprising an X-ray intensity control signal generator for generating an X-ray intensity signal control signal depending upon the state of the X-ray source and at least one state among the states of the first to nth exposure means.

In a preferred embodiment, the X-ray exposure apparatus further comprises a total control unit, which receives information for specifying the internal status of a point-source X-ray source unit having the point-source X-ray source, as a status signal from the point-source X-ray source unit, for exercising total control, which combined the shutter control unit and a plurality of controllers that control the exposure states of each of the exposure means based upon measurement values from a plurality of sensors that measure the X-ray intensities of respective ones of the exposure means, wherein the total control unit sends the X-ray emission trigger signal generating unit a trigger generation command and sends the X-ray intensity control signal generator and an X-ray intensity value and/or X-ray intensity command.

In a preferred embodiment, the total control unit has means for controlling exposure timing of each exposure means in accordance with a prescribed objective, the exposure timing being tunable within a range of set values that have been set in the total control unit.

In a preferred embodiment, the X-ray exposure apparatus further comprises first to nth moving means for moving at least one of respective ones of the masks and the substrates.

In a preferred embodiment, an optical-axis center of each collimator is configured radially with respect to the X-ray source.

For example, laser light is condensed to irradiate a solid metal target with pulsed laser light, thereby plasmatizing the metal surface of the target to generate X-rays.

In any of the X-ray exposure apparatus mentioned above, the type of the X-ray source is not limited to one that generates pulsed X-rays, and X-ray sources other than those that produce pulsed X-rays can be applied to the X-ray exposure apparatus of the embodiment.

With regard to a change in intensity of the X-rays owing to each of the n collimators from the first to the nth collimator, the X-ray intensity distribution may be made uniform by the design of each collimator if the intensity distribution of the X-rays emitted from the X-ray source is non-uniform.

A method of manufacturing a semiconductor device according to the present invention comprises the steps of placing a plurality of semiconductor manufacturing apparatus, which includes the above-described X-ray exposure apparatus, in a plant for manufacturing semiconductors, and manufacturing a semiconductor device by the plurality of semiconductor manufacturing apparatus.

A semiconductor manufacturing plant according to the present invention comprises: a plurality of semiconductor manufacturing apparatus inclusive of the above-described X-ray exposure apparatus, a local-area network for interconnecting the plurality of semiconductor manufacturing apparatus, and a gateway for connecting the local-area network and an external network outside the plant, whereby information relating to at least one of the plurality of semiconductor manufacturing apparatus can be communicated by data communication.

A method of maintaining an X-ray exposure apparatus installed in a semiconductor manufacturing plant according to the present invention comprises the steps of providing a maintenance database, which is connected to an external network of the semiconductor manufacturing plant, by a vendor or user of the X-ray exposure apparatus, connecting the X-ray exposure apparatus to a local-area network within the semiconductor manufacturing plant, and maintaining the X-ray exposure apparatus, based upon information that is stored in the maintenance database, utilizing the external network and the local-area network.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate an embodiment of the invention and, together with the description, serve to explain the principles of the invention.

FIG. 8 shows a specific example of a user interface in the semiconductor device production system that includes the exposure apparatus according to this embodiment;

DESCRIPTION OF THE PREFERRED EMBODIMENTS

Preferred embodiments of the present invention will now be described in detail with reference to the accompanying drawings.

In the embodiments set forth below, an X-ray stepper in which a mask pattern is transferred to a wafer by a step-and-repeat operation will be described. However, the present invention is not limited to the following embodiments.

First Embodiment

Figure 1:
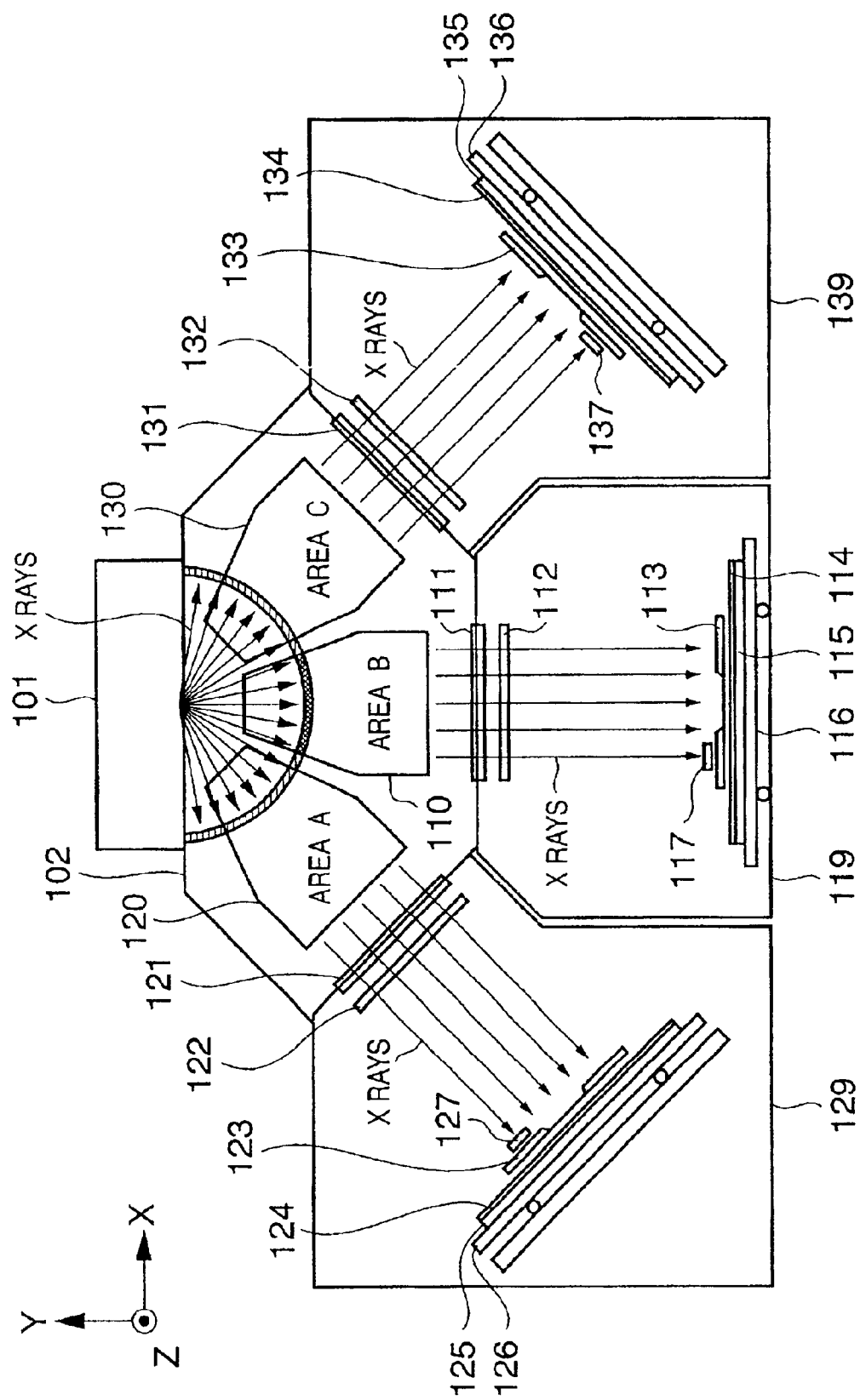
FIG. 1 is a schematic view illustrating an X-ray exposure apparatus according to a first embodiment of the present invention as seen from the side.
Figure 2:
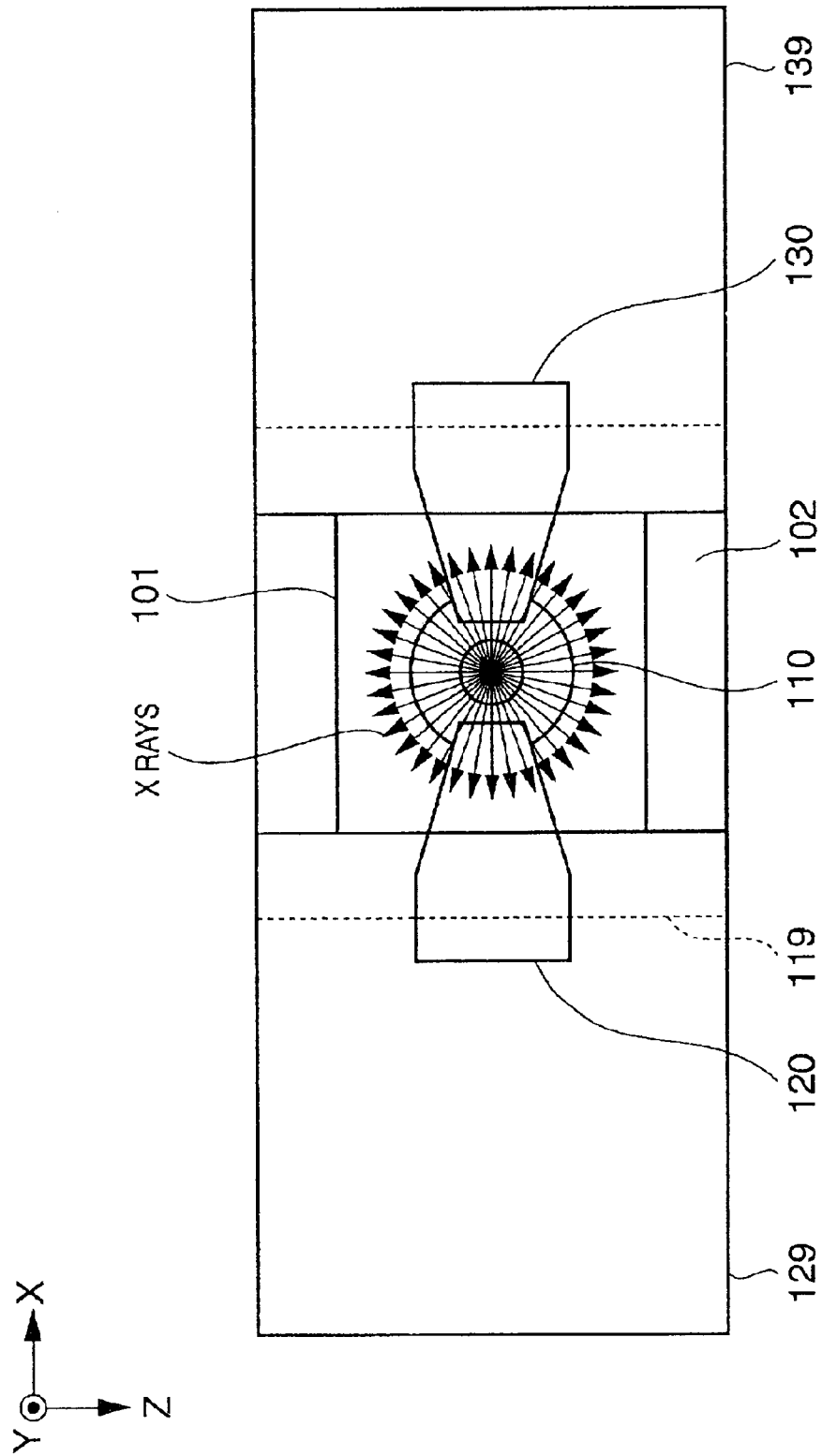
FIG. 2 is a schematic view illustrating the X-ray exposure apparatus according to the first embodiment of the present invention as seen from above.

Reference will be had to FIGS. 1 and 2 to describe an X-ray exposure apparatus according to first embodiment of the present invention. FIG. 1 is a schematic view illustrating an X-ray exposure apparatus according to a first embodiment of the present invention as seen from the side, and FIG. 2 is a schematic view illustrating the X-ray exposure apparatus according to this embodiment as seen from above.

The apparatus includes a point-source X-ray source 101 that uses a solid metal target (not shown) and condenses laser light (not shown) to apply the laser light to the target in the form of pulses. The metal surface thus irradiated with the laser light is plasmatized and produces X-rays. The intensity and pulse width with respect to time of the laser light can be controlled by an intensity adjustment mechanism in the laser oscillator, not shown. By varying the intensity and pulse width with respect to time of the laser light using the intensity adjustment mechanism, the point-source X-ray source 101 is capable of controlling the intensity of the X-rays generated.

In this X-ray exposure apparatus, the X-rays emitted by the point-source X-ray source 101 are introduced into a first collimator 110, second collimator 120 and third collimator 130. The centers of these three collimators 110 to 130 are disposed so as to have the same Z coordinate in the XYZ coordinate system of the drawings. The second collimator 120 uses X-rays in an area A as its input and the third collimator 130 uses X-rays in an area C as its input. Since the three collimator 110 to 130 in this case are disposed in a radial configuration with respect to the X-ray emission point of the point-source X-ray source 101, substantially the same design can be adopted for them. It is essential that the laser and target of the point-source X-ray source 101 be so disposed as not to interfere with an X-ray introduction chamber 102 and first, second and third exposure units 119, 129, 139, respectively.

In the X-ray exposure apparatus of this embodiment, the first, second and third exposure units 119, 129, 139 are connected to the first, second and third collimators 110, 120, 130, respectively. In the first exposure unit 119, a first mask 113 and first wafer 114 are placed so that their angles will conform approximately to the emission angle of the first collimator 110. The same is true with regard to the second exposure unit 129 and third exposure unit 139. In each of the exposure units 119, 129, 139, precise angular and positional adjustments between the optical axis of exposure and the masks 113, 123, 133 and wafers 114, 124, 134 is carried out by moving the exposure units 119, 129, 139, per se, or the collimators 110, 120, 130.

In the first exposure unit 119, the first mask 113 is brought in and sent out between a mask introduction section (not shown) and the exterior of the first exposure unit 119 by means of the mask introduction selection. The first mask 113 introduced to the first exposure unit 119 is delivered to a mask stage (not shown) by a mask transport system (not shown). The same is true with regard to the second exposure unit 129 and third exposure unit 139. Further, in the first exposure unit 119, the first wafer 114 is brought in and seat out between a wafer introduction section (not shown) and the exterior of the first exposure unit 119, by means of the wafer introduction section. The first wafer 114 introduced to the first exposure unit 119 is delivered to a first wafer stage 16 by a wafer transport system (not shown). The same holds true for the second exposure unit 129 and third exposure unit 139.

The first wafer stage 116, second wafer stage 126 and third wafer stage 136 are guided along respective ones of guides by gas bearings that employ helium gas. Position information concerning the wafer stages 116, 126, 136 is measured by laser interferometers (not shown) and the stages are driven by linear motors (not shown) based upon the measurements obtained.

The first mask 113 is positioned with respect to a reference mark in the first exposure unit 119 by a position detector and mask stage, neither of which are shown. The first mask 113 and first wafer 114 are positioned relative to each other by the position detector and mask stage (not shown) and by the first wafer stage 116. The second mask 123 and third mask 133 are positioned in the same manner.

Figure 3:
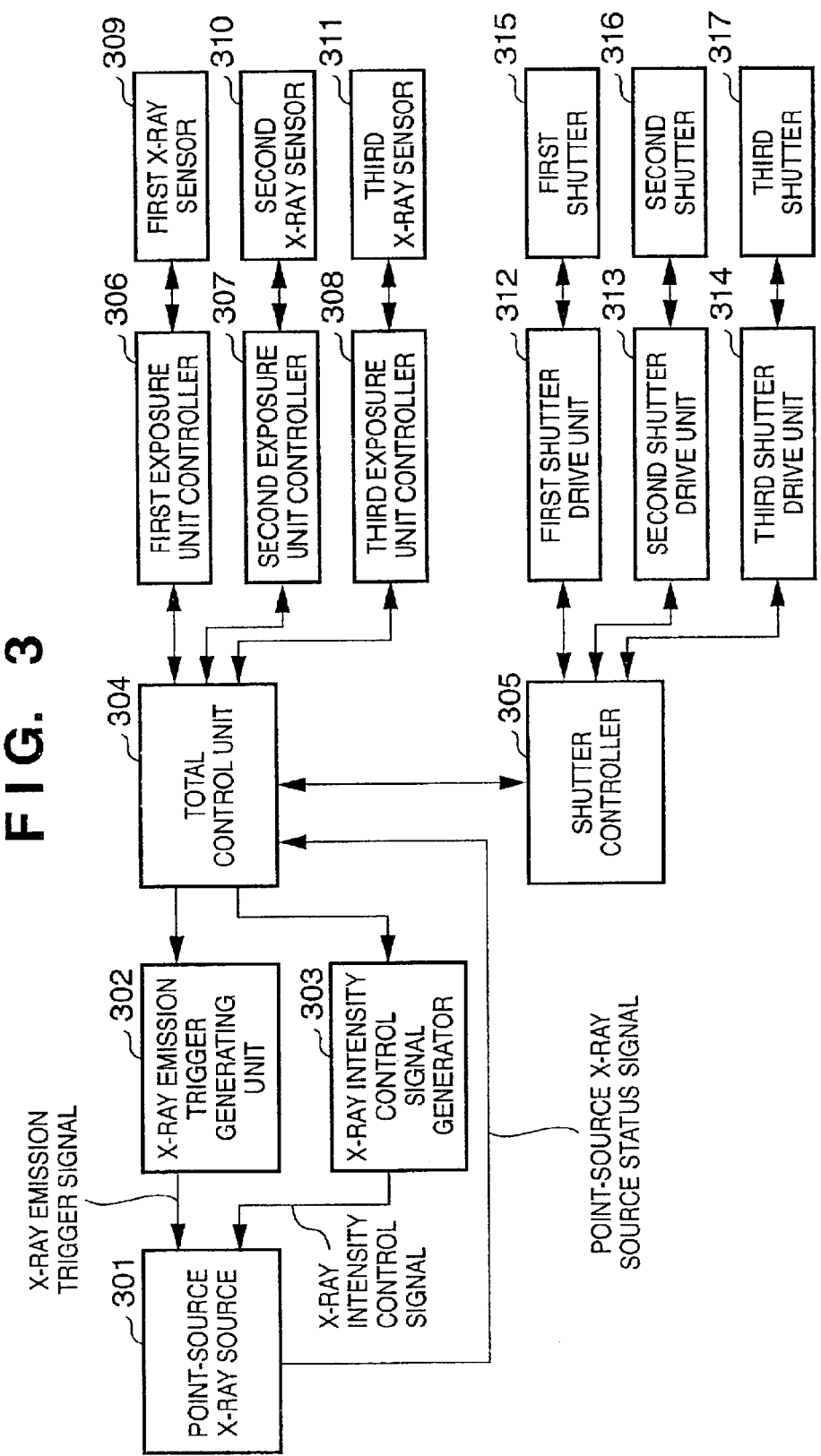
FIG. 3 is a control block diagram of the X-ray exposure apparatus according to the first embodiment.
Figure 4:
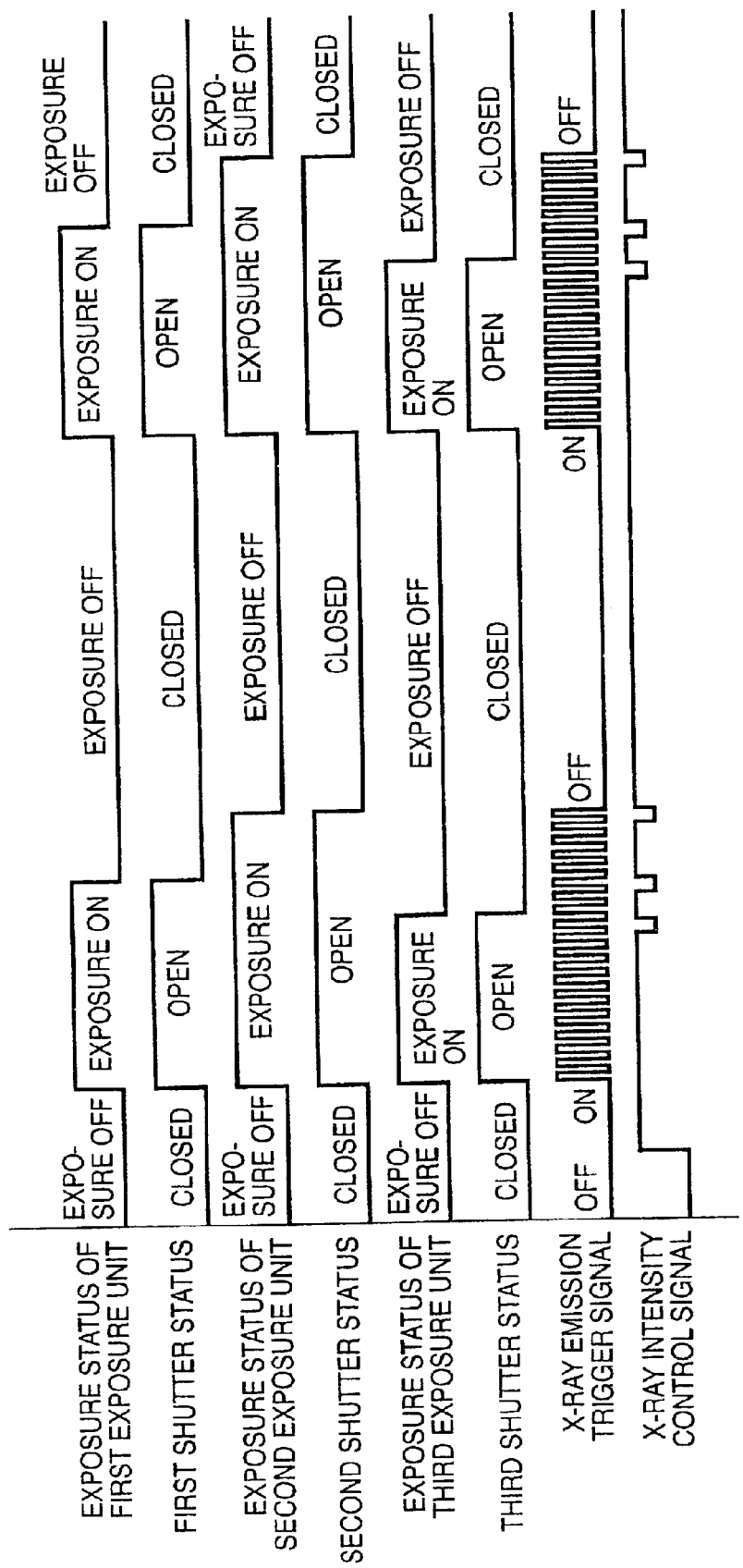
FIG. 4 is a diagram of control timing of the X-ray exposure apparatus according to the first embodiment.

A method of controlling the X-ray exposure apparatus according to this embodiment will now be described with reference to FIGS. 3 and 4, in which FIG. 3 is a control block diagram of the X-ray exposure apparatus according to this embodiment and FIG. 4 is a diagram of control timing of the X-ray exposure apparatus according to this embodiment.

The emission timing of the laser in a point-source X-ray source 301, namely, the X-ray emission timing, is decided by an X-ray emission trigger signal. Further, the point-source X-ray source 301 is such that the intensity of the emitted laser is decided by an X-ray intensity control signal. It is preferred that the X-ray emission trigger signal and X-ray intensity control signal be signals of the kind shown in FIG. 4.

Whether X-rays are capable of being emitted, and the internal device status, are constantly reported by the point-source X-ray source 301 to an exposure-apparatus total control unit 304 as a point-source X-ray source status signal.

A target value of an amount of exposure by the first exposure unit is set in the total control unit 304. The set value is transmitted to a first exposure-amount controller 306. The same is true with regard to the second and third exposure units. The total control unit 304 calculates target values of X-ray intensity and emission pulse count based upon the set value of an amount of exposure.

The total control unit 304 notifies an X-ray intensity control signal generator 303 of the X-ray intensity prevailing when the exposure is started, and the X-ray intensity control signal generator 303 sets the X-ray intensity control signal to a prescribed value. This control signal is set to prescribed values by the signal and timings shown in FIG. 4 and is output from the point-source X-ray source 301 to the X-ray intensity control signal generator 303.

When preparations for exposure of a shot to be exposed are completed in the first exposure unit, the first exposure unit controller 306 so notifies the total control unit 304. Alternatively, if the first exposure unit is not scheduled to perform exposure for the time being, the first exposure unit controller 306 notifies the total control unit 304 that the first exposure unit is idle. Operation is the same with regard to the second and third exposure units. When all of the first to third exposure units are ready to perform exposure or are idle, the total control unit 304 sends a shutter controller 305 a command to open the shutter (first shutter 35, second shutter 36 or third shutter 317) corresponding to the exposure unit that is ready to perform exposure. In other words, a shutter corresponding to an exposure unit in the idle state is left closed. In this embodiment, the timings shown in FIG. 4 are adopted as an example of timings of the exposure states (exposure ON/exposure OFF) of the first to third exposure units and timings of the states (open/closed) of the first to third shutters. Since an exposure unit in the idle state does not undergo control of an amount of exposure, the description rendered below assumes that none of the exposure units are idle.

The shutter controller 305 causes first, second and third shutter drive units 312, 313 and 314, respectively, to exercise control so as to open the first, second and third shutters 315, 316 and 317, respectively, whereby the shutters 315, 316, 317 are driven by the shutter driver units 313, 313, 314, respectively. Upon confirming that opening of the shutters 315, 316, 317 is completed, the first through third shutter drive units 312 to 314 so notify the shutter controller 305. Upon being so notified, the shutter controller 305 similarly notifies the exposure-apparatus total control unit 304.

The exposure-apparatus total control unit 304 receives signals giving notification of the status of the point-source X-ray source, notification of completion of shutter opening and notification that the first to third exposure units are ready to perform exposure. Upon judging that exposure is possible based upon these notification signals, the total control unit 304 starts the exposure operation. At this time, the total control unit 304 issues a trigger generation command to an X-ray emission trigger generating unit 302. The latter outputs an X-ray emission trigger signal to the point-source X-ray source 301. The X-ray emission trigger signal is output as the pulsed signal and at the timings shown in FIG. 4, by way of example.

The first exposure unit controller 306 measures the X-ray intensity by a first X-ray sensor 309, thereby obtaining an integrated value from the start of exposure of the first shot. The exposure-apparatus total control unit 304 reads the integrated value of X-ray intensity out of the first exposure unit controller 306 for every X-ray emission pulse. The total control unit 304 notifies the X-ray intensity control signal generator 303 to lower the X-ray intensity if the integrated value of X-ray intensity of the first exposure unit has approached the target value of the amount of exposure and the difference between them has fallen below a certain threshold value. As a result, the error between the target value of the amount of exposure and the actual amount of exposure of one shot in the first exposure unit diminished. These operations are the same with regard to the second exposure unit controller 307 and second X-ray sensor 310 and with regard to the third exposure unit controller 308 and third X-ray sensor 311.

If X-ray intensity is controlled across the board in the above method, there is the possibility that an error in the amount of exposure will take on a large value because the target value has already been reached or because of the other exposure units whose integrated target values of the amount of exposure are nearly the same. In order to prevent this, the total control unit 304 has adjustment means for varying the threshold value, which is used in evaluating the error, in conformity with the target value of the amount of exposure of each exposure unit.

With regard to the first exposure unit controller 306, the total control unit 304 judges the error in the amount of exposure in the first exposure unit from the target value of X-ray intensity of the next pulse and performs a calculation, pulse by pulse, to determine whether the error is the minimum error. If it is determined that the exposure error is minimum, then the exposure-apparatus total control unit 304 sends the shutter controller 305 a command to close the first shutter 315, thereby terminating exposure of one shot. These operations are the same with regard to the second exposure unit controller 307 and third exposure unit controller 308.

In this embodiment, three exposure units are provided. However, the present invention is not limited to three exposure units. Two or more exposure units may be used and there is no limit upon the number of exposure units so long as this number of units can be installed.

Second Embodiment

Figure 5:
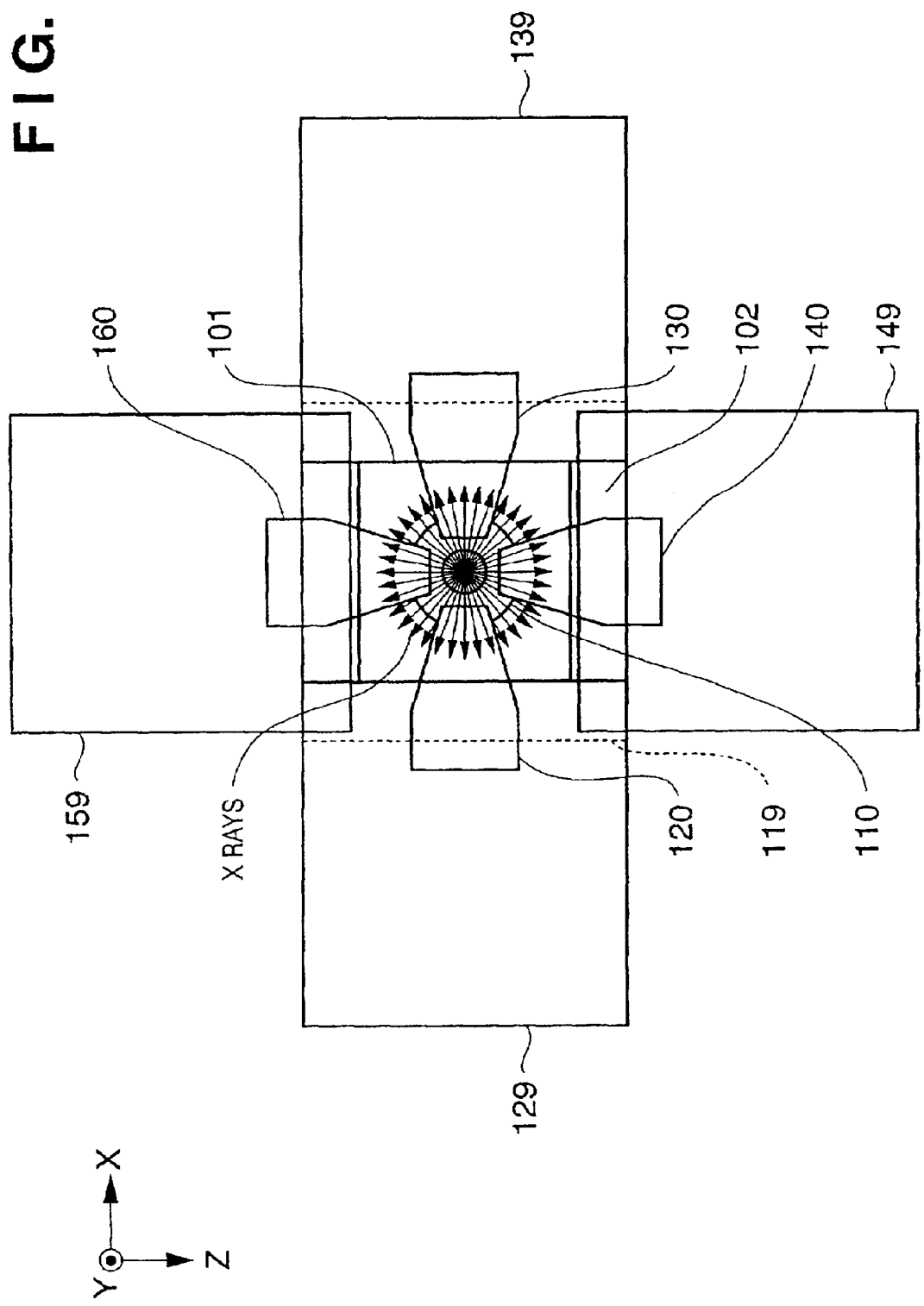
FIG. 5 is a schematic view illustrating an X-ray exposure apparatus according to another embodiment of the present invention as seen from above.

A second embodiment of the present invention will now be described. FIG. 5 is a schematic view illustrating an X-ray exposure apparatus according to this embodiment, in which components identical with those shown in the FIGS. 1 and 2 are designated by like reference characters.

As shown in FIG. 5, a fourth exposure unit 149, fourth collimator 140, fifth exposure unit 159 and fifth collimator 150 can be provided in addition to the first to third exposure units and first to third collimators of the first embodiment. These additional exposure units and collimators are disposed along the Z-axis. This embodiment makes it possible to raise the utilization efficiency of the X-ray source even further.

Third Embodiment

A third embodiment of the present invention will now be described. In this embodiment, all or part of the wafer transport system, which is for supplying wafers to each of the exposure units and ejecting wafers whose exposure has been completed, can be shared by each of the first to third exposure units of the first embodiment and by each of the first to fifth exposure units of the second embodiment.

Further, all or part of the system for transporting masks or masks on which circuit patterns have been rendered for being burned into wafers can be shared by each of the first to third exposure units of the first embodiment and by each of the first to fifth exposure units of the second embodiment.

Fourth Embodiment

A fourth embodiment of the present invention will now be described. In each of the foregoing embodiments, the shots of n-number of exposure units start to be exposed simultaneously. An X-ray exposure apparatus using an exposure timing other than this will be described in this embodiment.

In FIG. 3, the exposure-apparatus total control unit 304 can exercise control in such a manner that the exposure timings of the n exposure units are made to conform to particular objectives. Examples of these objectives are an improvement in the utilization efficiency of the X-ray source, a reduction in exposure processing time and suppression of a decline in precision caused by vibration between exposure units.

In order to achieve the above, the X-ray exposure apparatus according to this embodiment sets a redundancy-allowance threshold value Tth of exposure processing time and redundancy-allowance threshold value of Pth of X-ray source pulses in the exposure apparatus total control unit 304 beforehand. In a range within which these two threshold values are not exceeded, the X-ray exposure apparatus of this embodiment is capable of tuning exposure timing in accordance with the above-objectives.

In this embodiment, control of the amount of exposure of each shot is carried out by controlling both the number of exposure pulses and the X-ray intensity of the X-ray source in a manner similar to that described in the first embodiment. Further, the requirements concerning exposure processing time and the requirements concerning utilization efficiency of the X-ray source are decided depending upon the aim at the time the apparatus is utilized. These requirements need only be decided based upon the particular priority.

Embodiment of a Semiconductor Production System

Described next will be an example of a system for producing semiconductor devices (e.g., semiconductor chips such as IC and LSI chips, liquid crystal panels, CCDs, thin-film magnetic heads and micromachines, etc.) utilizing the X-ray exposure apparatus described above. This system utilizes a computer network outside the semiconductor manufacturing plant to provide troubleshooting and regular maintenance of manufacturing equipment installed at the manufacturing plant and to furnish maintenance service such as the provision of software.

Figure 6:
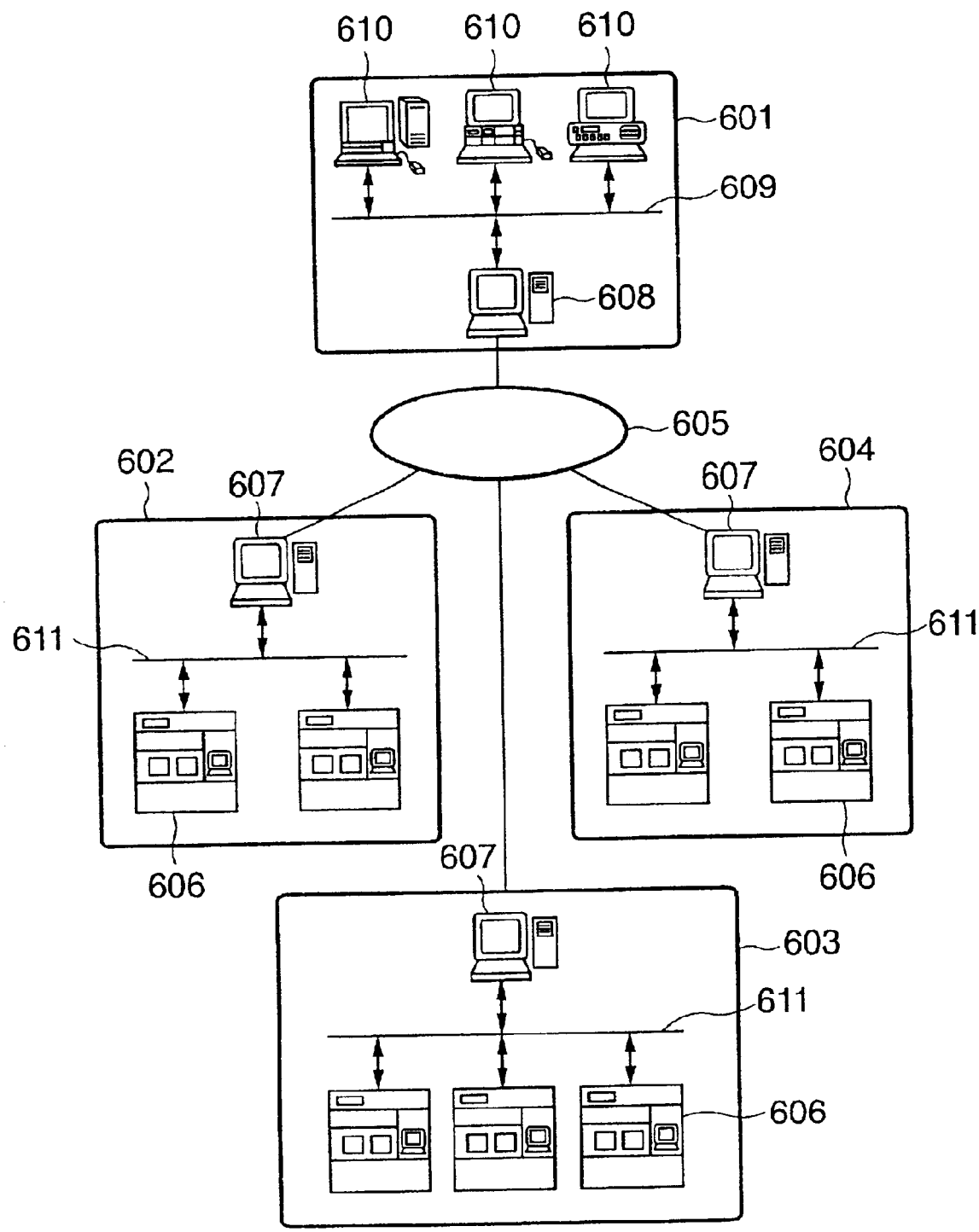
FIG. 6 is a conceptual view showing a semiconductor device production system, which includes an exposure apparatus according to an embodiment of the invention, as seen from a certain angle.

FIG. 6 illustrates the overall system as seen from a certain angle. As shown in FIG. 6, the system includes the business office 601 of the vendor (equipment supplier) that provides the equipment for manufacturing semiconductor devices. Semiconductor manufacturing apparatus for performing various processes used in a semiconductor manufacturing plant is assumed to be an actual example of the manufacturing apparatus. Examples of the apparatus are pre-treatment apparatus (e.g., lithographic apparatus such as exposure apparatus, resist treatment apparatus and etching apparatus, heat treatment apparatus, thin-film apparatus and smoothing apparatus, etc.) and post-treatment apparatus (e.g., assembly apparatus and inspection apparatus, etc.). The business office 601 includes a host management system 608 for providing a manufacturing-apparatus maintenance database, a plurality of control terminal computers 610, and a local-area network (LAN) 609 for connecting these components into an intranet. The host management system 608 has a gateway for connecting the LAN 609 to the Internet 605, which is a network external to the business office 601, and a security function for limiting access from the outside.

Numerals 602 to 604 denote manufacturing plants of semiconductor makers (e.g., semiconductor device makers), which are the users of the manufacturing apparatus. The manufacturing plants 602 to 604 may be plants belonging to makers that differ from one another or plants belonging to the same maker (e.g., pre-treatment plants and post-treatment plants, etc.). Each of the plants 602 to 604 is provided with a plurality of manufacturing apparatus 606, a local-area network (LAN) 611, which connects apparatus to construct an intranet, and a host management system 607 serving as a monitoring unit for monitoring the status of operation of each manufacturing apparatus 606. The host management system 607 provided at each of the plants 602 to 604 has a gateway for connecting the LAN 611 in each plant to the Internet 605 serving as the external network of the plants. As a result, it is possible for the LAN of each plant to access the host management system 608 on the side of the vendor 610 via the Internet 605. By virtue of the security function of the host management system 608, users allowed to access the host management system 608 are limited. More specifically, status information (e.g., the condition of manufacturing apparatus that has malfunctioned), which indicates the status of operation of each manufacturing apparatus 606, can be reported from the plant side to the vendor side. In addition, information in response to such notification (e.g., information specifying how to trouble-shoot the problem, troubleshooting software and data, etc.), as well as the latest software and maintenance information such as help information, can be acquired from the vendor side. A communication protocol (TCP/IP), which is used generally over the Internet, is employed for data communication between the plants 602~604 and the vendor 601 and for data communication over the LAN 611 within each plant. Instead of utilizing the Internet as the external network of a plant, it is also possible to utilize a highly secure leased-line network (e.g., an ISDN, for example) that cannot be accessed by a third party. Further, the host management system is not limited to that provided by a vendor, for an arrangement may be adopted in which the user constructs a database, places it on an external network and allows the database to be accessed from a number of plants that belong to the user.

Figure 7:
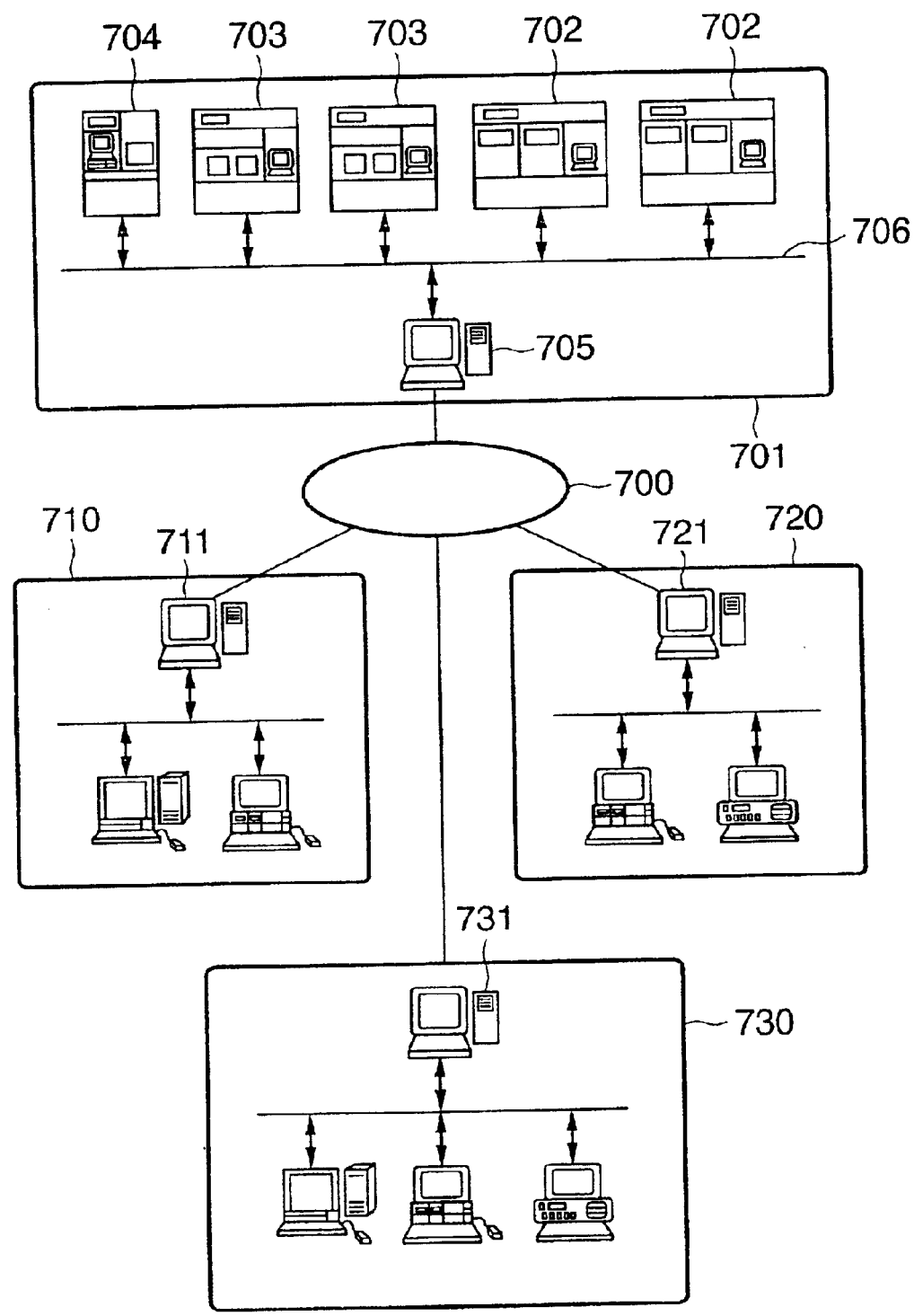
FIG. 7 is a conceptual view showing the semiconductor device production system, which includes the exposure apparatus according to this embodiment, as seen from another angle.

FIG. 7 is a conceptual view illustrating the overall system of this embodiment as seen from an angle different from that depicted in FIG. 6.

In the earlier example, a plurality of user plants each having manufacturing apparatus are connected by an external network to the management system of the vendor that provided the manufacturing apparatus, and information concerning the production management of each plant and information concerning at least one manufacturing apparatus is communicated by data communication via the external network. In the example of FIG. 7, on the other hand, a plant having a manufacturing apparatus provided by a plurality of vendors is connected by an outside network to management systems of respective ones of the vendors of these plurality of manufacturing apparatus, and maintenance information for each manufacturing apparatus is communicated by data communication. As shown in the drawing, the system includes a manufacturing plant 701 of the user of the manufacturing apparatus, (e.g., the maker of semiconductor devices). The manufacturing line of this plant includes manufacturing apparatus for implementing a variety of processes. Examples of such apparatus are an exposure apparatus 702, a resist treatment apparatus 703 and a thin-film treatment apparatus 704. Though only one manufacturing plant 701 is shown in FIG. 7, in actuality, a plurality of these plants are networked in the same manner. The apparatus in the plant are interconnected by a LAN 706 to construct an intranet and the operation of the manufacturing line is managed by a host management system 705. The business offices of vendors (e.g., equipment suppliers) such as an exposure apparatus maker 710, a resist treatment apparatus maker 720 and a thin-film apparatus equipment maker 730 have host management systems 711, 721, 731, respectively, for remote maintenance of the apparatus they have supplied. These have maintenance databases and gateways to the outside network, as described earlier.

The host management system 705 for managing each apparatus in the manufacturing plant of the user is connected to the management systems 711, 721, 731 of the vendors of these apparatus by the Internet or leased-line network serving as an external network 700. If any of the series of equipment in the manufacturing line malfunctions, the line ceases operating. However, this can be dealt with rapidly by receiving remote maintenance from the vendor of the faulty equipment via the Internet 700, thereby making it possible to minimize line downtime.

Each manufacturing apparatus installed in the semiconductor manufacturing plant has a display, a network interface and a computer for executing network-access software and equipment operating software stored in a storage device. The storage device can be an internal memory or hard disk or a network file server. The software for network access includes a special-purpose or general-purpose Web browser and presents a user interface, which has a screen of the kind shown by way of example in FIG. 8, on the display. The operator managing the manufacturing equipment at each plant enters information at the input items on the screen while observing the screen. The information includes model 801 of the manufacturing apparatus, its serial number 802, subject matter 803 of the problem, its date of occurrence 804, degree of urgency 805, the particular condition 806, countermeasure method 807 and progress report 808. The entered information is transmitted to the maintenance database via the Internet. The resulting appropriate maintenance information is sent back from the maintenance database and is presented on the display screen. The user interface provided by the Web browser implements hyperlink functions 810, 811, 812 as illustrated and enables the operator to access more detailed information for each item, to extract the latest version of software, which is used for the manufacturing equipment, from a software library provided by the vendor, and to acquire an operating guide (help information) for reference by the plant operator. Accordingly, the maintenance information provided by the maintenance database also includes information relating to the present invention described above, and the software library also provides the latest software for implementing the present invention.

Figure 9:
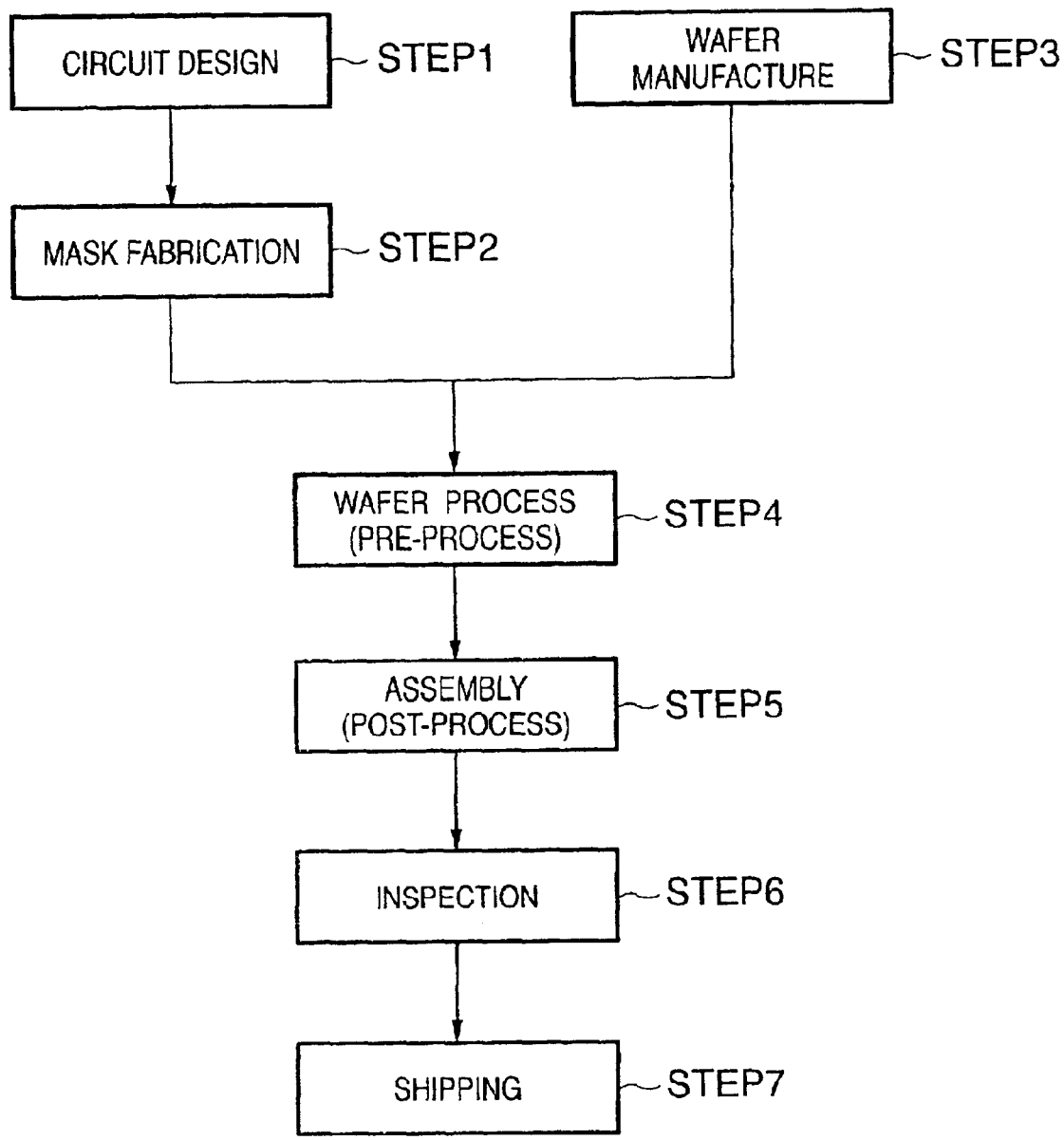
FIG. 9 is a diagram useful in describing the flow of a device manufacturing process that uses the exposure apparatus according to this embodiment.

A process for manufacturing a semiconductor device utilizing the production system set forth above will now be described. FIG. 9 illustrates the overall flow of a process for manufacturing semiconductor devices. The circuit for the device is designed at step 1 (circuit design). A mask on which the designed circuit pattern has been formed is fabricated at step 2 (mask fabrication). Meanwhile, a wafer is manufactured using a material such as silicon or glass at step 3 (wafer manufacture). The actual circuit is formed on the wafer by lithography, using the mask and wafer that have been prepared, at step 4 (wafer process), which is also referred to as "pre-treatment". A semiconductor chip is obtained, using the wafer fabricated at step 4, at step 5 (assembly), which is also referred to as "post-treatment". This step includes steps such as actual assembly (dicing and bonding) and packaging (chip encapsulation). The semiconductor device fabricated at step 5 is subjected to inspections such as an operation verification test and a durability test, at step 6 (inspection). The semiconductor device is completed through these steps and then is shipped (step 7). The pre- and post-treatments are performed at separate special-purpose plants. Maintenance is carried out on an a per-plant basis by the above-described remote maintenance system. Further, information for production management and equipment maintenance is communicated by data communication between the pre- and post-treatment plants via the Internet or leased-line network.

Figure 10:
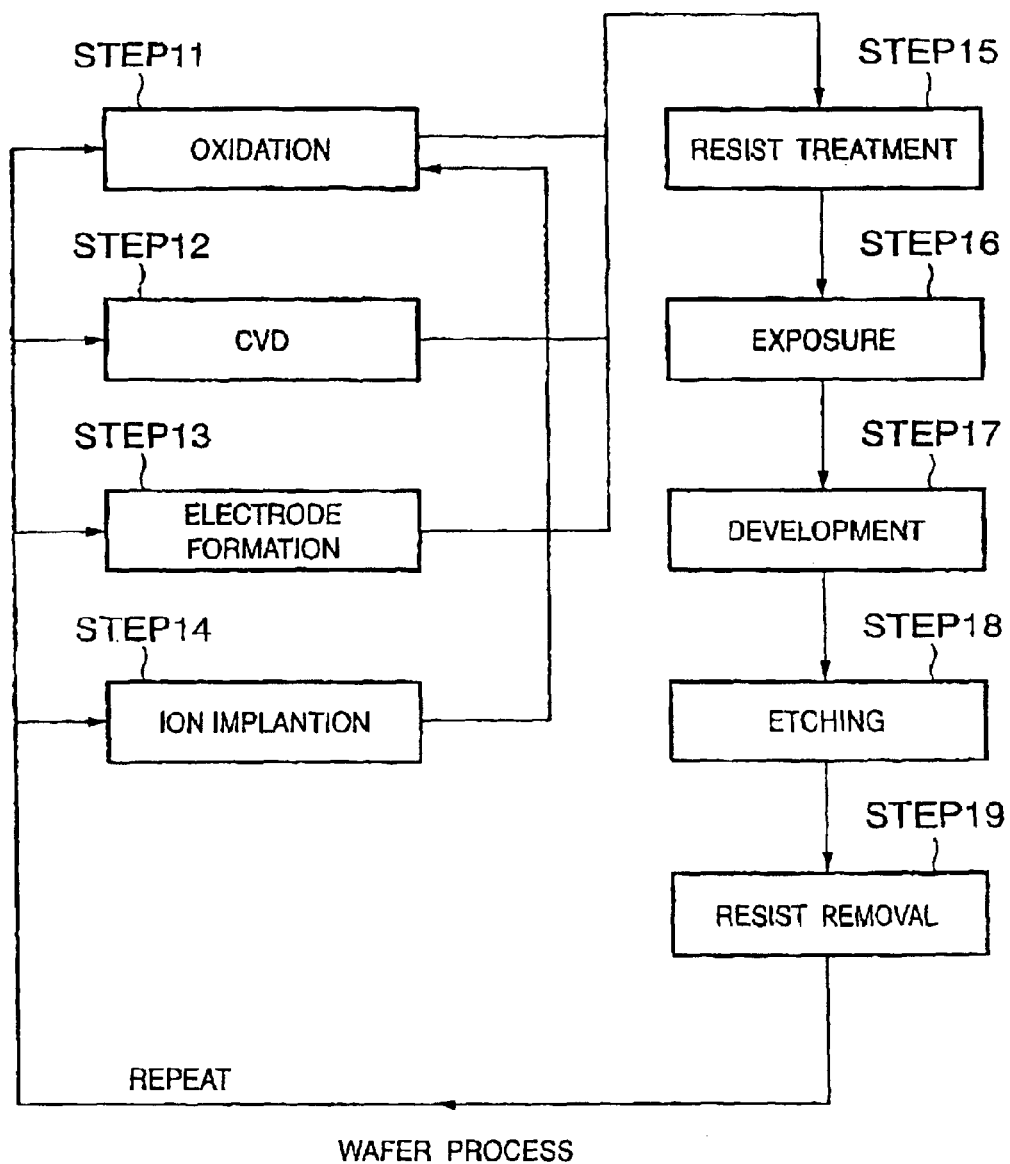
FIG. 10 is a diagram useful in describing a wafer process that uses the exposure apparatus according to this embodiment.
Figure 11:
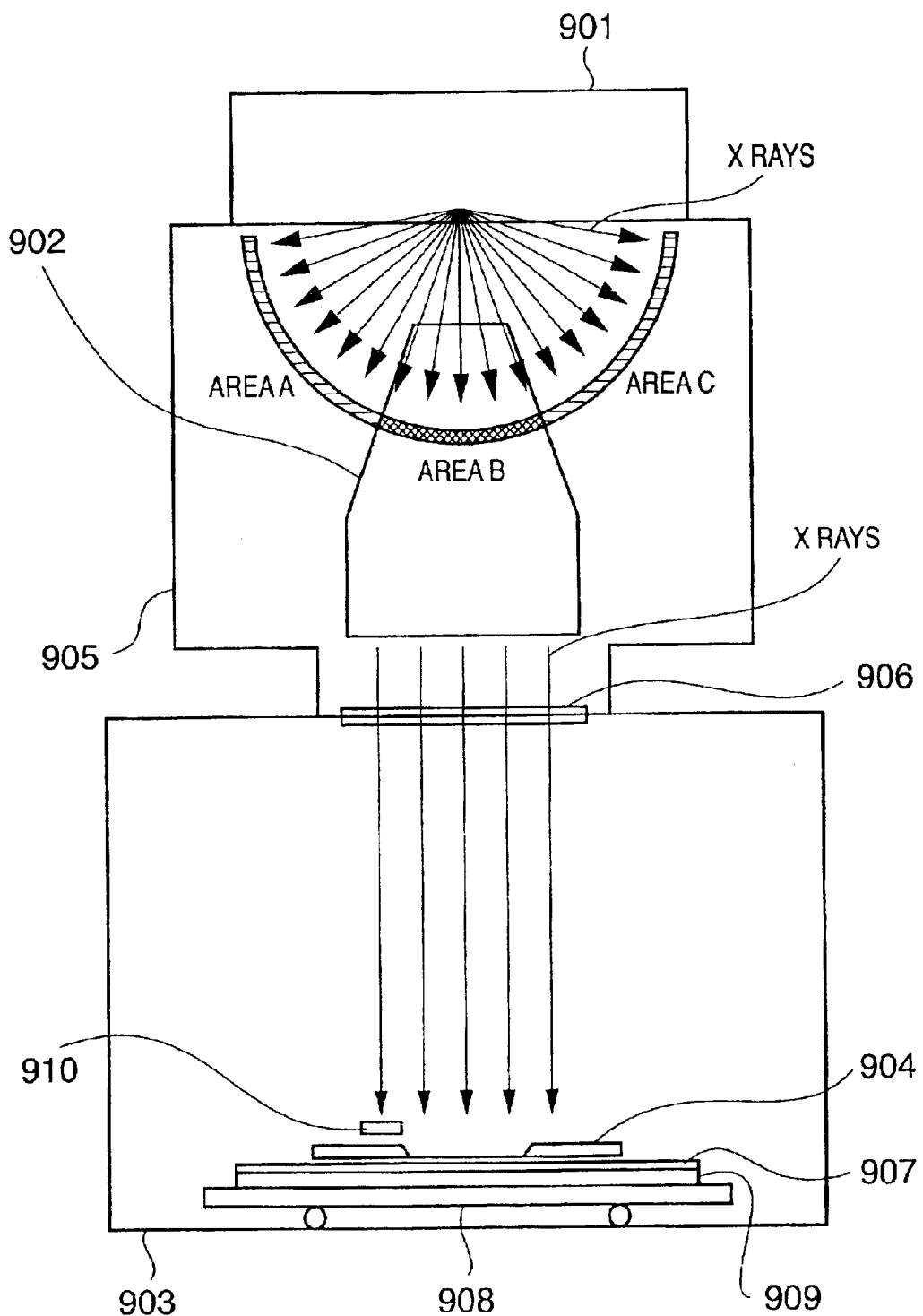
FIG. 11 is a schematic view illustrating an example of the structure of an X-ray exposure apparatus having a point-source X-ray source according to the prior art.

FIG. 10 is a flowchart illustrating the detailed flow of the wafer process mentioned above. The surface of the wafer is oxidized at step 11 (oxidation). An insulating film is formed on the wafer surface at step 12 (CVD), electrodes are formed on the wafer by vapor deposition at step 13 (electrode formation), and ions are implanted in the wafer at step 14 (ion implantation). The wafer is coated with a photoresist at step 15 (resist treatment), the wafer is exposed to the circuit pattern of the mark to print the pattern onto the wafer by the above-described exposure apparatus at step 16 (exposure), and the exposed wafer is developed at step 17 (development). Portions other than the developed photoresist are etched away at step 18 (etching), and unnecessary resist left after etching is performed is removed at step 19 (resist removal). Multiple circuit patterns are formed on the wafer by implementing these steps repeatedly. Since the manufacturing equipment used at each step is maintained by the remote maintenance system described above, malfunctions can be prevented and quick recovery is possible if a malfunction should happen to occur. As a result, the productivity of semiconductor device manufacture can be improved over the prior art.

Thus, in accordance with the present invention as described above, it is possible to provide an X-ray exposure apparatus in which the energy of the X-rays emitted by an X-ray source can be utilized in a highly efficient manner. Further, the number of X-ray sources (light sources) can be reduced with respect to a plurality of collimators and plurality of exposure means disposed in the X-ray exposure apparatus of the present invention. This makes it possible to lower cost and reduce installation space. In addition, labor involved in maintaining the X-ray source can be reduced in comparison with the X-ray exposure apparatus of the prior art.

As many apparently widely different embodiments of the present invention can be made without departing from the spirit and scope thereof, it is to be understood that the invention is not limited to the specific embodiments thereof except as defined in the claims.

What is claimed is:

1. An X-ray exposure apparatus comprising:
  a point X-ray source for generating pulsed X-rays, which are emitted radially from said point X-ray source;
  first to nth exposure-means, each of which is disposed in a position facing said point X-ray source to receive the pulsed X-rays in an approximately perpendicular direction, to each of the first to nth exposure means,
  wherein said exposure means project patterns of first to nth masks onto respective ones of first to nth substrates that are to be exposed.

2. The apparatus according to claim 1, further comprising:
first to nth, where a represents an integer of at least two, collimators for varying at least one of angle and intensity of X-rays generated by said X-ray source.

3. The apparatus according to claim 1, further comprising:
first to nth shutters situated between said X-ray source and respective ones of the masks and having at least one shielding member for shielding X-rays that irradiate the masks;
first to nth shutter drive units for driving respective ones of said shutters; and
a shutter controller for controlling each of said shutters.

4. The apparatus according to claim 3, wherein said shutter drive unit controls said first to nth shutters depending upon the state of said X-ray source and at least one state among the states of said first to nth exposure means.

5. The apparatus according to claim 1, wherein timing of X-ray emission from said X-ray source is controlled by an X-ray emission trigger signal,
said apparatus further comprising an X-ray emission trigger generating unit for generating the X-ray emission trigger signal depending upon the state of said X-ray source and at least one state among the states of said first to nth exposure means.

6. The apparatus according to claim 1, wherein intensity of X-rays from said X-ray source is controlled by an X-ray intensity control signal,
said apparatus further comprising an X-ray intensity control signal generator for generating an X-ray intensity signal control signal depending upon the state of said X-ray source and at least one state among the states of said first to nth exposure means.

7. The apparatus according to claim 6, further comprising a total control unit, which receives information for specifying the internal status of a point source X-ray source unit having said point-source X-ray source, as a status signal from said point-source X-ray source unit, for exercising total control which combine said shutter control unit and a plurality of controllers that control the exposure states of each of said exposure means based upon measurement values from a plurality of sensors that measure the X-ray intensities of respective ones-of said exposure means,
wherein said total control unit sends said X-ray emission trigger signal generating unit a trigger generation command and sends said X-ray intensity control signal generator at least one of an X-ray intensity value and an X-ray intensity command.

8. The apparatus according to claim 7, wherein said total control unit has means for controlling exposure timing of each exposure means in accordance with a prescribed objective, said exposure timing being tunable within a range of set values that have been set in said total control unit.

9. The apparatus according to claim 1, further comprising first to nth moving means for moving at least one of respective ones of said masks and said substrates.

10. The apparatus according to claim 1, wherein an optical-axis center of each collimator is configured radially with respect to the X-ray source.

11. The apparatus according to claim 1, further comprising:
an interface for being connected to a network;
a computer for running network software for communicating maintenance information for said exposure apparatus by data communication via the network; and
a display for displaying the maintenance information for said exposure apparatus communicated by the network software run by said computer.

12. The apparatus according to claim 11, wherein said network software provides said display with a user interface for accessing a maintenance database, which is connected to an external network of a plant at which said X-ray exposure apparatus has been installed, and which is supplied by a vendor or user of the X-ray exposure apparatus, thereby making it possible to obtain information from the database via said external network.

13. A method of manufacturing a semiconductor device comprising the steps of:
placing a plurality of semiconductor manufacturing apparatus, inclusive of an X-ray exposure apparatus, in a plant for manufacturing semiconductor devices; and
manufacturing a semiconductor device using the plurality of manufacturing apparatus,
the X-ray exposure apparatus including:
(i) a point X-ray source for generating pulsed X-rays, which at emitted radially from the X-ray source; and
(ii) first to nth exposure means, each of which is disposed in a position facing said point X-ray source to receive the pulsed X-rays in an approximately perpendicular direction to each of the first to nth exposure means,
wherein the exposure means project patterns of first to nth masks onto respective ones of first to nth substrates that are to be exposed.

14. The method according to claim 13, further comprising:
interconnecting the plurality of semiconductor manufacturing apparatuses by a local-area network;
connecting the local-area network and an external network outside the plant;
acquiring information relating to the exposure apparatus from a database on the external network utilizing the local-area network and the external network; and
controlling the exposure apparatus based upon the information acquired.

15. The method according to claim 14, wherein maintenance information for the manufacturing apparatus is obtained by accessing, by data communication via the external network a database provided by a vendor or user of the exposure apparatus, or production management is performed by data communication with a semiconductor manufacturing plant other than the first-mentioned semiconductor manufacturing plant via the external network.

16. A semiconductor manufacturing plant, comprising:
a plurality of semiconductor manufacturing apparatus inclusive of an exposure apparatus;
a local-area network for interconnecting said plurality of semiconductor manufacturing apparatus; and
a gateway for connecting said local-area network and an external network outside said plant, whereby information relating to at least one of said plurality of semiconductor manufacturing apparatus can be communicated by data communication,
said X-ray exposure apparatus including:
(i) a point X-ray source for generating pulsed X-rays, which are emitted radially from said point X-ray source; and
(ii) first to nth exposure means, each of which is disposed in a position facing said point X-ray source to receive the pulsed X-rays in an approximately perpendicular direction, to each of the first to nth exposure means,
wherein said exposure means project patterns of first to nth masks onto respective ones of first to nth substrates that are to be exposed.

17. A method of maintaining an X-ray exposure apparatus installed in a semiconductor manufacturing plant, said method comprising the steps of:

provifing a maintenance database, which is connected to an external network of the semiconductor manufacturing plant, by a vendor or user of the X-ray exposure apparatus;

connecting the X-ray exposure apparatus to a local-area network within the semiconductor manufacturing plant; and maintaining the X-ray exposure apparatus, based upon information that is stored in the maintenance database, utilising the external network and the local-area network, the X-ray exposure apparatus including:
(i) a point X-ray source for generating pulsed X-rays, which are emitted radially from said point X-ray source; and
(ii) first to nth exposure means, each of which is disposed in a position facing said point X-ray source and to receive the X-rays in an approximately perpendicular direction, to each of the first to nth exposure means, wherein said exposure means project patterns of first to nth masks onto respective ones of first to nth substrates that are to be exposed.

* * * * *

UNITED STATES PATENT AND TRADEMARK OFFICE
CERTIFICATE OF CORRECTION

PATENT NO. : 6,754,302 B2
DATED : June 22, 2004
INVENTOR(S) : Atsushi Kitaoka

It is certified that error appears in the above-identified patent and that said Letters Patent is hereby corrected as shown below:

Drawings,
Sheet 10, Fig. 10, in "STEP 14," "IMPLANTION" should read -- IMPLANTATION --.

Column 1,
Line 36, "bit" should read -- but --.

Column 2,
Line 65, "if is it" should read -- if it is --.

Column 3,
Line 29, "provided and" should read — provide an --.
Line 66, "combined" should read -- combines --.

Column 5,
Line 54, "first" should read -- the first --.
Line 67, "oscillator, not shown." should read -- oscillator (not shown). --.

Column 6,
Line 13, "collimator" should read -- collimators --.
Line 31, "is carried" should read -- are carried --.
Line 32, "110,120," should read -- 110, 120, --.

Column 7,
Line 40, "35," should read -- 315, --.
Line 41, "36," should read -- 316, --.

Column 8,
Line 21, "diminished." should read -- is diminished. --.

Column 9,
Line 33, "above-objectives." should read -- above objectives --.

Column 10,
Line 63, "these" should read -- this --.

Column 12,
Line 13, "on an a" should read -- on a --.
Line 60, "exposure-means," should read -- exposure means, --.

UNITED STATES PATENT AND TRADEMARK OFFICE
CERTIFICATE OF CORRECTION

PATENT NO. : 6,754,302 B2
DATED : June 22, 2004
INVENTOR(S) : Atsushi Kitaoka

It is certified that error appears in the above-identified patent and that said Letters Patent is hereby corrected as shown below:

Column 13,
Line 2, "where a" should read -- where n --.
Line 34, "point source" should read -- point-source --.
Line 41, "ones-of" should read -- ones of --.
Line 55, "claim 1," should read -- claim 2, --.

Column 14,
Line 17, "which at" should read -- which are --.
Line 40, "network" should read -- network, --.
Line 55, "said X-ray" should read -- the --.

Column 15,
Line 13, "utilising" should read -- utilizing --.

Column 16,
Line 7, "and to" should read -- to --.

Signed and Sealed this

Nineteenth Day of April, 2005

JON W. DUDAS
*Director of the United States Patent and Trademark Office*